United States Patent [19]

Yamada et al.

[11] Patent Number: 5,082,695
[45] Date of Patent: Jan. 21, 1992

[54] METHOD OF FABRICATING AN X-RAY EXPOSURE MASK

[75] Inventors: Masao Yamada, Yokohama; Masafumi Nakaishi, Inagi; Kenji Nakagawa, Isehara; Yuji Furumura, Kawasaki; Takashi Eshita, Inagi; Fumitake Mieno, Kawasaki, all of Japan

[73] Assignee: 501 Fujitsu Limited, Kawasaki, Japan

[21] Appl. No.: 314,794

[22] Filed: Feb. 24, 1989

[30] Foreign Application Priority Data

Mar. 8, 1988 [JP] Japan .................. 63-54364
Mar. 8, 1988 [JP] Japan .................. 63-54365

[51] Int. Cl.⁵ .................. C23C 16/32; G03F 9/00
[52] U.S. Cl. .................. 427/249; 427/255; 427/255.2; 430/5
[58] Field of Search .................. 427/249, 255.2, 255; 437/100; 430/5

[56] References Cited

U.S. PATENT DOCUMENTS

| | | | |
|---|---|---|---|
| 3,451,867 | 6/1969 | Taft et al. | 437/100 |
| 3,382,113 | 5/1968 | Ebert et al. | 437/100 |
| 3,501,356 | 3/1970 | Chu | 437/100 |
| 3,577,285 | 5/1971 | Rutz | 427/249 |
| 3,960,619 | 6/1976 | Seiter | 437/100 |
| 3,972,749 | 8/1976 | Pavlichenko | 437/100 |
| 4,028,149 | 6/1977 | Deines et al. | 437/100 |
| 4,847,215 | 7/1989 | Hanaki et al. | 437/100 |
| 4,881,257 | 11/1989 | Nakagawa | 430/5 |
| 4,941,942 | 7/1990 | Bruns et al. | 430/5 |

FOREIGN PATENT DOCUMENTS

| | | |
|---|---|---|
| 0244496 | 5/1986 | European Pat. Off. . |
| 0310183 | 9/1988 | European Pat. Off. . |
| 51-20869 | 6/1976 | Japan .................. 437/100 |
| 53-20767 | 2/1978 | Japan . |
| 60-093440 | 5/1985 | Japan . |
| 61-198722 | 9/1986 | Japan . |
| 61-199770 | 9/1987 | Japan . |
| 62-216325 | 9/1987 | Japan . |
| 2100713A | 6/1982 | United Kingdom . |

OTHER PUBLICATIONS

Arnold W. Yanof, "Electron-Beam, X-ray, and Ion-Beam Technology: Submicrometer Lithographies VII," pp. 10–15, Santa Clara, Calif., Mar. 2–4, 1988.
Patent Abstracts of Japan, vol. 12, No. 77, Mar. 10, 1988.

*Primary Examiner*—Shrive Beck
*Assistant Examiner*—Margaret Burke
*Attorney, Agent, or Firm*—Staas & Halsey

[57] ABSTRACT

A method of fabricating an X-ray exposure mask including the steps of forming a $\beta$-SiC membrane by chemical vapor deposition and simultaneously doping the membrane with at least one of phosphorous, boron, nitrogen and oxygen.

11 Claims, 5 Drawing Sheets

METHOD OF FABRICATING AN X-RAY EXPOSURE MASK

BACKGROUND OF THE INVENTION

The present invention relates to an X-ray exposure mask; and more particularly, to an X-ray exposure mask having an X-ray transmissive membrane with improved flatness.

DESCRIPTION OF THE RELATED ART

An x-ray exposure mask comprises a so-called membrane that passes X-rays; an X-ray absorber pattern formed on this membrane that comprises a material having a large X-ray absorption coefficient; and a supporting frame that supports the membrane. An X-ray exposure apparatus comprises: an X-ray exposure mask on which a predetermined X-ray absorber pattern is formed; a semiconductor wafer that is positioned close to the mask and has a surface coated with an X-ray resist; and an X-ray source that provides X-rays above the mask. Irradiating the mask with the X-rays from the X-ray source transfers the X-ray absorber pattern of the X-ray mask to the X-ray resist formed on the surface of the semiconductor wafer.

The film or membrane that passes the X-rays is a very important element because it significantly affects the quality and cost of an X-ray mask. The important characteristics of the membrane include:

(1) The membrane must be able to pass X-rays and visible light. The visible light is typically used to align the X-ray exposure mask with a semiconductor wafer.

(2) The membrane should be able to support the weight of an X-ray absorber without distortion of its shape. If the shape of the membrane is distorted, then the X-ray absorber pattern formed on the X-ray exposure mask will not be accurately transferred to the X-ray resist on the semiconductor wafer. Therefore, the membrane should be made of a material that has a large Young's modulus and a tensile stress so that it will have a planar surface when formed.

(3) The membrane should not be damaged by exposure to X-rays.

Suitable membrane materials include, BN film, SiN film, Si thin film and $\beta$ type (Zincblende structure)—SiC. However, BN film is easily damaged by X-rays; and SiN film has a small Young's modulus, namely it is a soft material. The S thin film is only slightly damaged when exposed to X-ray, but transmits little visible light. A $\beta$-SiC film almost satisfies the above conditions and is very effective as the membrane of X-ray exposure mask. A $\beta$-SiC film is disclosed in, for example, U.S. Pat. No. 3,873,824 and Japanese patent bulletin, Laid-open No. 53-20767. However, as these references indicate, the membrane surface includes projections and recessed portions. These surfaces are thought to occur because the film comprises a polycrystalline SiC film.

If the surface of the membrane is not flat, then visible light is reflected in an irregular manner. This makes mask alignment difficult. Moreover, if the X-ray absorber material is formed and patterned on the surface of polycrystalline $\beta$-SiC film, accurate patterning cannot be performed because of the projections and recessed portions of the membrane surface. In addition, it is difficult to satisfactorily remove the unwanted X-ray absorber. Accordingly, it is very desirable that the surface of membrane be perfectly flat in order to avoid the above problems.

Japanese Laid-open patent No. 62-216325 discloses that $\beta$-SiC film is epitaxially grown on a silicon substrate to form a membrane consisting of a $5\mu$–$10\mu$ thick $\beta$ type SiC film. This $\beta$-SiC single crystal film has a flat surface, but is not acceptable as a membrane material as discussed below. Namely, to form a flat surface, a single crystal SiC film is used for the membrane. However, the method for fabricating a membrane as disclosed in this reference cannot provide good crystal property of the SiC film. Another problem with the method taught by this reference is that the single crystal SiC film can only be formed with a thickness up to 0.4 $\mu$m. But, if a 2~3 $\mu$m thick SiC film, which is required for an X-ray exposure mask membrane, is formed the SiC film changes to polycrystalline. This is probably due to a difference of about 20% between lattice constants of the silicon used for substrate and the $\beta$ type SiC.

SUMMARY OF THE INVENTION

It is an object of the present invention to provide a method for fabricating an X-ray -exposure mask having the above described important characteristics.

It is also an object of the present invention to provide a method for fabricating a X-ray mask that has a flat surface even for thick masks.

The present invention provides a method for fabricating an X-ray exposure mask including a membrane that passes X-rays; an X-ray absorber formed on the membrane and comprising a material with a large X-ray absorbing coefficient; and a semiconductor substrate supporting the membrane. The membrane is grown on the semiconductor substrate using a chemical vapor deposition method which is conducted during doping of an impurity. When a $\beta$-SiC film is formed in this manner, the crystal property of the $\beta$-SiC film can be improved and the single crystal $\beta$-SiC film membrane can be thicker than those previously possible. Moreover, when a $\beta$-SiC film is formed on a semiconductor substrate by using chemical vapor deposition while doping the film with an impurity, the resulting $\beta$-SiC film formed on the semiconductor substrate is an amorphous film. The amorphous film has a grain or particle size that is smaller than that of a polycrystalline material and thereby the membrane surface is flatter than that of a polycrystalline membrane. Thus, even when a thick film is formed the film remains flat.

BRIEF DESCRIPTION OF THE DRAWINGS

FIG. 5(*b*) is a graph showing an X-ray diffraction peak of a SiC film fabricated in accordance with the present invention;

FIG. 5(*c*) is a schematic diagram of an X-ray diffraction peak measuring apparatus.

DESCRIPTION OF THE PREFERRED EMBODIMENTS

Figure 1:
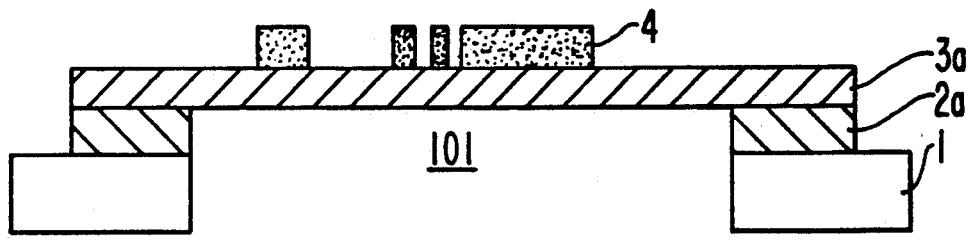
FIG. 1 is a cross-sectional view of an X-ray exposure mask.

FIG. 1 is a cross-sectional view of an X-ray exposure mask. In this figure, 2a denotes a silicon substrate. For example, it is a disk, 2°~8° off from the (111) surface orientation with diameter of 4 inches, and a thickness of 525 μm. An internal hole or opening part 101 has a diameter of 60 mm. A membrane 3a is formed on the substrate 2a by a fabrication process as described below and passes X-rays. The membrane 3a has a flat surface and comprises, for example, a single crystal having a thickness of 2 μm~3 μm or an amorphous β-SiC film. The term amorphous means a material where the atoms are arranged in an irregular fashion. A supporting frame 1 is bonded to the silicon substrate 2a and supports both the silicon substrate 2a and membrane 3a. The supporting frame 1 can preferably comprise, for example, a hard SiC ceramic which is resistive to chemicals such as HF, $HNO_3$ and KOH, etc. An X-ray absorber 4 comprises a material, such as Au, W, Ta, which is capable of absorbing X-rays and which is selectively formed on the surface of membrane 3a.

Figure 2A:
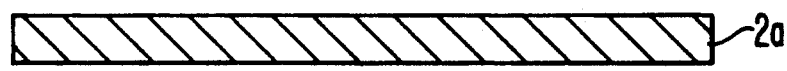
FIGS. 2(*a*), 2(*b*), 2(*c*), 2(*d*), 2(*e*), 2(*f*), 2(*g*), and 2(*h*) are cross-sectional views illustrating the fabrication stages of an X-ray exposure mask in accordance with the present invention.
Figure 2B:
Figure 2C:
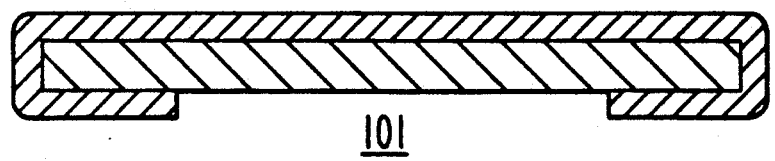
Figure 2D:
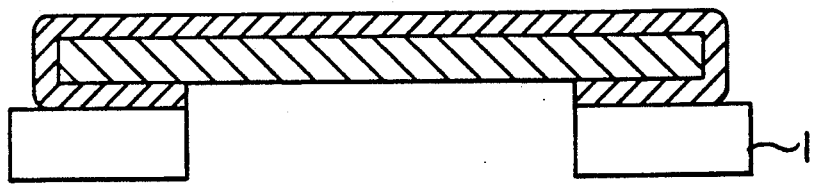
Figure 2E:
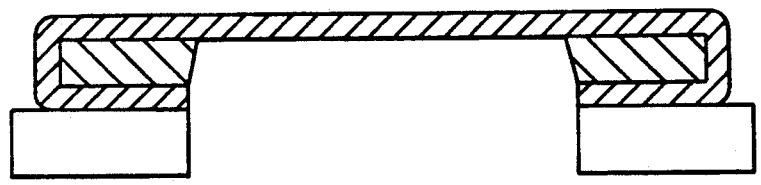

FIGS. 2(a)–2(h) are cross-sectional views illustrating the fabrication stages of an X-ray exposure mask in accordance with the present invention. Referring to FIGS. 2(a) and (b), a membrane of 2–3 μm thick β type SiC is formed on the surface of a silicon substrate 2a. The substrate 2a comprises silicon having dimensions of 525 μm thick and 4 inches in diameter. The membrane 3a is then selectively etched (FIG. 2(c)) using, for example, a reactive ion etching method. A resulting opening 101, in a rear surface of the substrate 2a, has a diameter of about 60 mm. Next, a portion of the membrane 3a at the peripheral portion of the opening 101 is bonded to a disk type supporting frame 1 as shown in FIG. 2(d). The supporting frame 1 has an inner opening with a diameter of 60 mm and can be bonded to the membrane 3a using, for example, an epoxy resin. The membrane 3a and supporting frame 1 are then used as a mask for etching the substrate 2a. For example, the silicon substrate 2a is wet-etched, using $HF/HNO_3/CH_3COOH$ as an etchant, so as to expose the membrane 3a formed on a front surface of silicon substrate 2a as shown in FIG. 2(e).

Figure 2F:
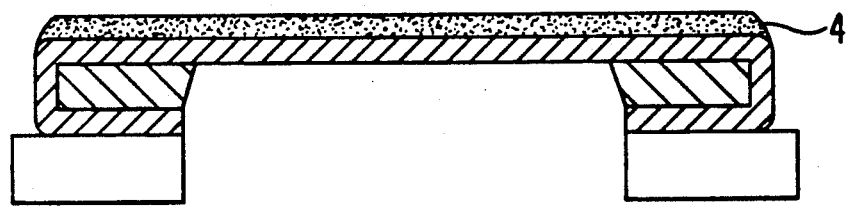

Next, an X-ray absorber 4 is deposited by, for example, sputtering on the surface of membrane 3a as shown in FIG. 2(f). The absorber 4 comprises a heavy metal that is capable of absorbing X-rays, such as Au, Ta, W or materials with similar characteristics.

Figure 2G:
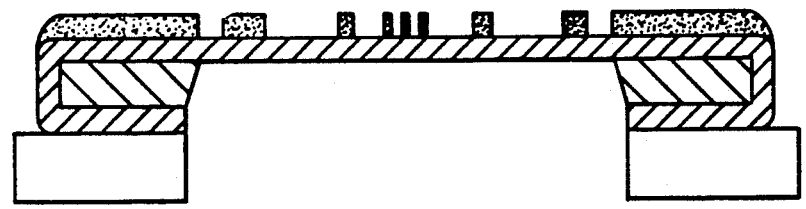
Figure 2H:
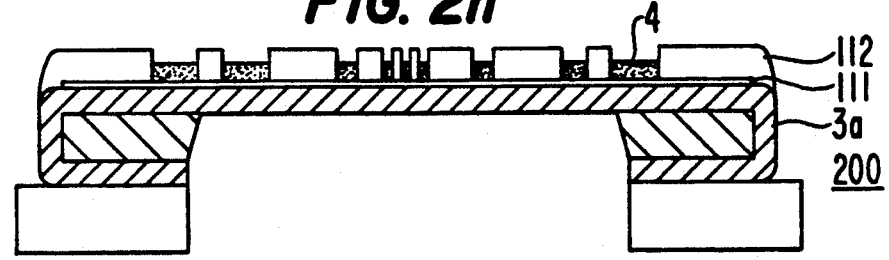

Referring to FIG. 2(g), after forming a resist (not shown) on the surface of the X-ray absorber 4 and the resist are patterned in accordance with the resist pattern by, for example, a reactive ion etching method. As an alternative to the process steps discussed with respect to FIGS. 2(f) and (g), a thin electrode metal layer 111 and resist 112 can be deposited on the surface of membrane 3a. The resist 112 is then patterned and the X-ray exposure mask 200 is immersed into a plating solution and a voltage is applied to the electrode metal layer 111. Thereby, the X-ray absorbing metal 4 can be plated when the resist has been removed. The resist 112 is removed to form the X-ray exposure mask.

Figure 3:
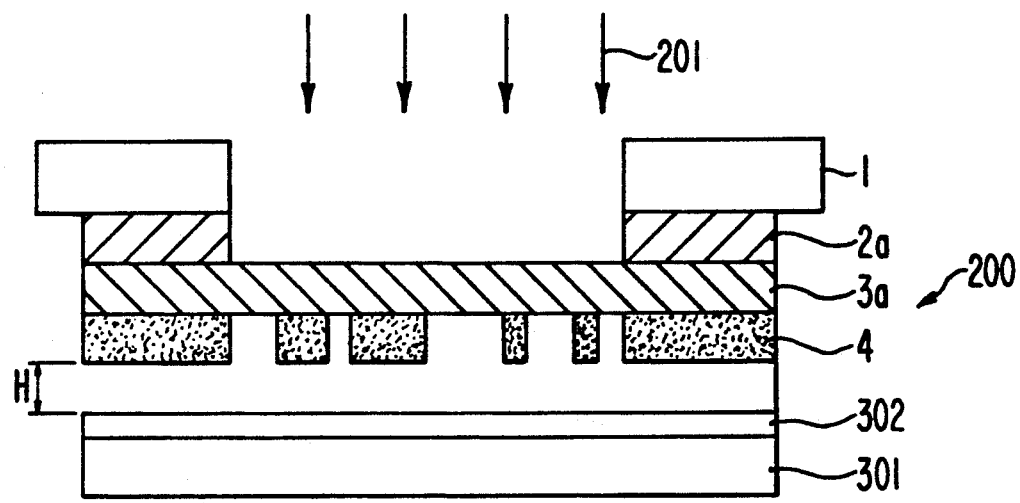
FIG. 3 is an exploded cross-sectional view of an X-ray exposure mask fabricated in accordance with the present invention.

FIG. 3 is an exploded cross-sectional view of an X-ray exposure mask fabricated in accordance with the present invention. In FIG. 3, reference numeral 200 identifies an ray exposure mask stay; reference numeral 301 identifies semiconductor wafer with an X-ray resist 302 positioned thereon. Reference numeral 201 illustrates X-rays. To transfer the X-ray absorber pattern 4 to the X-ray resist 302, the X-ray exposure mask 200 is positioned adjacent the resist 302 and X-rays are irradiated toward the rear surface of the X-ray exposure mask 200 as schematically shown in FIG. 3. A typical space H between the mask 200 and resist 302 is, for example, 20~40 μm.

A method for fabricating the β-SiC membrane in accordance with the present invention is discuses below.

According to the present invention, the β-SiC membrane 3a is formed on the silicon substrate 2a using chemical vapor deposition (hereinafter referred to as the CVD) method while doping the membrane with an impurity. In a first embodiment of the present invention, a single crystal β-SiC membrane 3a is formed on the silicon substrate 2a. In a second embodiment, an amorphous β-SiC membrane 3a is formed on the silicon substrate 2a. In both embodiments any impurity can be used, such impurities include, for example, phosphorus (P), boron (B), nitrogen (N) and oxygen (O), or a combination of such impurities.

In the first embodiment of the present invention, the conditions for growing a single crystal β-SiC membrane 3a while doping phosphorus (P) are as follows.
Reaction temperature: 850° C.~1360° C.
Doped gas:
    Halogenide silane gas ($SiHCl_3$, $SiH_2Cl_2$) . . . 700 SCCM
    Hydrocarbon gas ($C_3H_8$) . . . 30 SCCM
    Reduction gas ($H_2$) . . . 7 SLM
    Impurity gas ($PH_3$) . . . 0.1 cc/min
Pressure: 200 Pa
Doping concentration of phosphorus (P): $1 \times 10^{18} \sim 1 \times 10^{19} /cm^3$ If oxygen (O), boron (B) or nitrogen (N) is the desired impurity then, the impurity gas can be, respectively $O_2$, $B_2H_6$ and $NH_3$. The amount of each impurity gas is selected depending upon the type of impurity. Also, as noted above, several types of impurity gases can be used at the same time.

In the second embodiment of the present invention, the conditions for growing an amorphous β-SiC membrane 3a while doping phosphorus (P) are as follows.
Growth temperature: 850°~1360° C.
Doped gas:
    Halogenide silane gas ($SiHCl_3$) . . . 700 SCCM
    Hydrocarbon gas ($C_3H_8$) . . . 30 SCCM
    Reduction gas ($H_2$) . . . 7 SLM
    Impurity gas ($PH_3$) . . . 0.1 cc/min
Doping concentration of P: $2 \times 10^{19}$ pcs/$cm^3$ or more.

If boron (B), nitrogen (N) or oxygen (O) is the desired impurity, then the impurity gas can be, respectively, $B_2H_6$, $NH_3$ or $O_2$. An amorphous β-SiC can also be formed by doping more than one impurities at the same time. If the membrane 3a is doped with an excessive amount of oxygen (O), then the membrane can be easily damaged by X-rays.

While the second embodiment has been described using a preferred a high temperature (850° C.~1360° C.) to form a hard amorphous SiC film 3a, the present invention is not limited to these conditions. For example, an amorphous SiC film can also be obtained by using a low temperature such as 250° C.~450°, and depositing the film using plasma CVD. However, when using a low temperature, the halogenide silane gas and hydrocarbide gas, introduced into the reaction chamber, do not decompose as completely as when using a high temperature. Also, a large amount of hydrogen (H) may easily enter the membrane 3a. This lowers the resistivity of membrane 3a to X-ray damage.

One difference between the first and second embodiments is that concentration of the impurity doped into the membrane in the second embodiment is higher than the concentration in the first embodiment.

Figure 4:
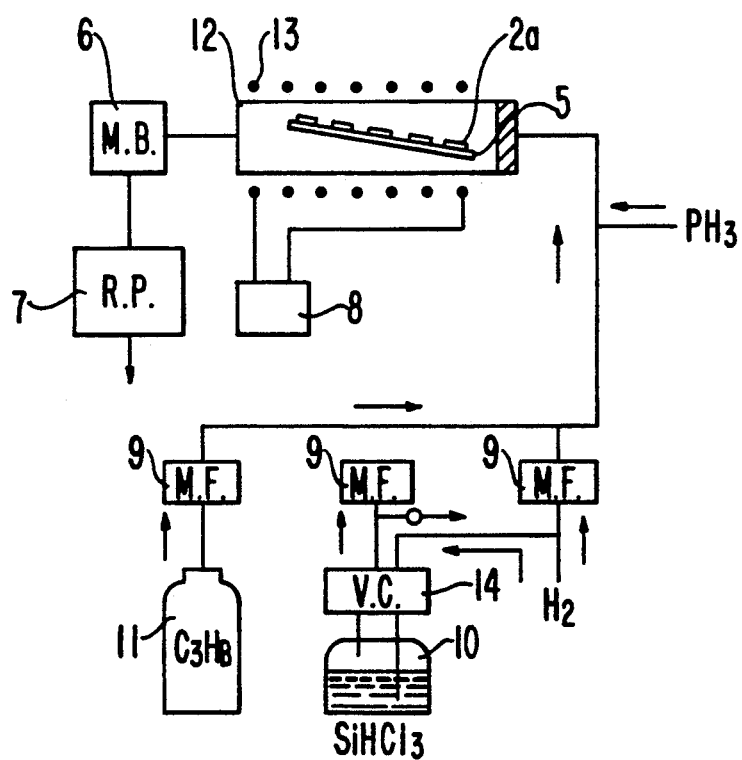
FIG. 4 is a schematic diagram of a CVD apparatus.

FIG. 4 is a schematic diagram of a CVD apparatus. In this figure, reference numeral 2a identifies a silicon substrate; reference numeral 5 identifies a susceptor; reference numeral 6 identifies a mechanical booster exhaust pump; reference numeral 7 identifies a rotary pump; reference numeral 8 identifies an oscillator; reference numeral 9 identifies a mass flow controller; reference numeral 10 identifies halogenide silane gas including $SiHCl_3$; reference numeral 11 identifies hydrocarbon gas including, for example, $C_3H_8$; reference numeral 12 identifies a reaction furnace; reference numeral 13 identifies a work coil; and reference numeral 14 identifies a vaporizer controller.

The following discusses a method for fabricating a $\beta$-SiC membrane with reference to FIG. 4. The reaction furnace 12 is evacuated to about 200 Pa using the mechanical booster exhaust pump 6 and rotary pump 7. The reaction chamber 12 is then high frequency heated up to, for example, 1000° C., using the oscillator 12 and work coil 13. Next, the halogenide silane gas 10, hydrocarbon gas 11, hydrogen gas, and a constant amount of an impurity gas (as, for example, specified above) are supplied to the reaction furnace 12. Within the reaction chamber 12, the halogenide silane gas 10 and the hydrocarbon gas 11 are reduced with the hydrogen gas. Under this condition, when the silicon substrate 2a, which is set on a susceptor 5, is put into the reaction furnace 12, a single crystal or an amorphous $\beta$-SiC having a thickness of about $2 \sim 3$ $\mu$m can be formed on the surface of the silicon substrate 2a.

Figure 5A:
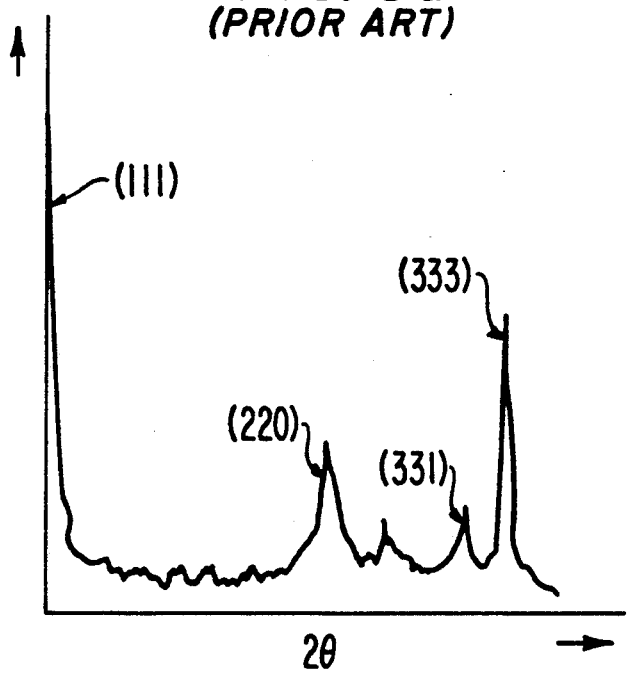
FIG. 5(*a*) is a graph showing an X-ray diffraction peak of a SiC film of the prior art.
Figure 5B:
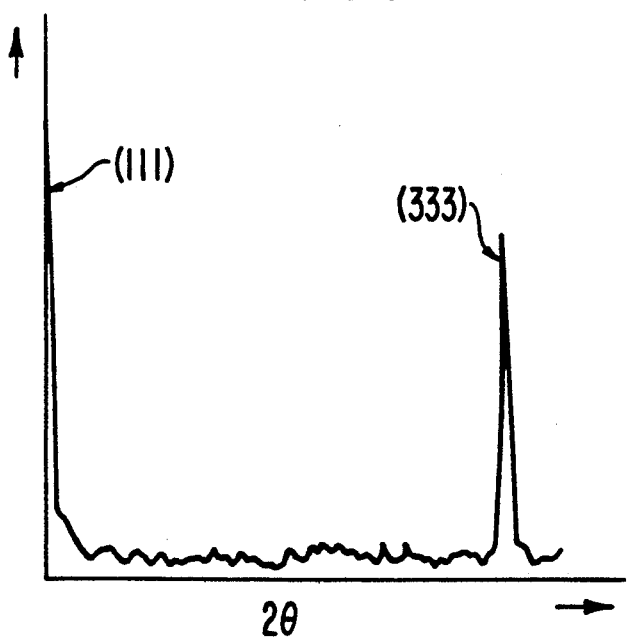
Figure 5C:
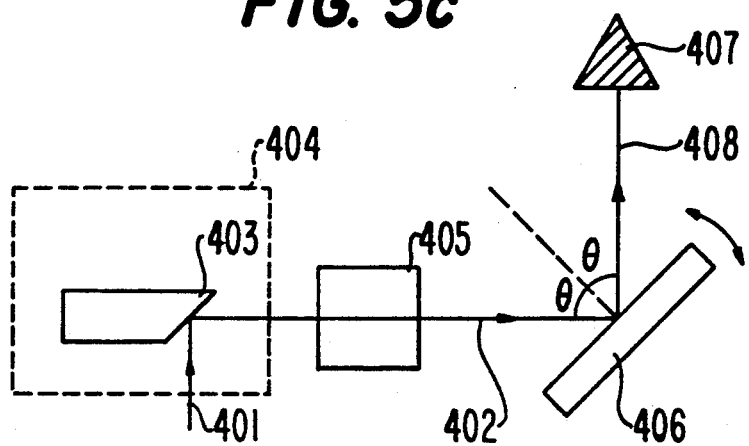

FIG. 5(c) is a schematic diagram of an X-ray diffraction peak measuring apparatus. A method for measuring the X-ray diffraction peak is explained below. First, a measuring sample 406 is placed in the apparatus. This sample should be movable within the apparatus so as to permit the inclination angle $\theta$ thereof to be adjusted at least in the direction of the arrow in FIG. 5(c). An electron beam 401 is then applied a target 403 within a source 404. The target 403 comprises, for example, copper. This generates X-rays 402 to be emitted from the X-ray source 404. Thereafter, the emitted X-rays are collimated in a collimeter 405. The collimated X-rays 402 are applied to and diffracted by the measuring sample 406. A diffracted X-ray beam 408 is measured by an X-ray counter 407.

FIGS. 5(a) and 5(b) are graphs showing the strength of an diffracted X-ray beam measured with an apparatus such as shown in FIG. 5(c). The horizontal axis indicates a sum of an incident angle of the incident X-ray beam 402 and the diffraction angle for the diffracted X-ray beam 408; while the vertical axis indicates the strength of the X-ray diffracted beam 408.

The FIG. 5(a) is a graph showing an X-ray diffraction peak of a polycrystalline SiC film formed on the silicon substrate 2a with a thickness of about 2 $\mu$m as taught by the prior art. The membrane disclosed in the Japanese Laid-open Patent No. 62-216325 becomes polycrystalline SiC when it is formed with a thickness of $2 \sim 3$ $\mu$m. Such a film therefore has characteristics of $2 \sim 3$ $\mu$m. Such a film therefore has characteristics such as shown in FIG. 5(a). The FIG. 5(a) waveform has peaks (111), (220), (331) and (333). Such a characteristic waveform indicates that a SiC film is polycrystalline.

The FIG. 5(b) is a graph showing an X-ray diffraction angle of a single crystal film formed on the silicon substrate 2a with a thickness of about 2 $\mu$m in accordance with the present invention. Comparing FIGS. 5(a) and 5(c) indicates that the FIG. 5(a) peaks (220) and (331) are not in FIG. 5(b). This means that the FIG. 5(b) membrane film is certainly a single crystal film.

Figure 6:
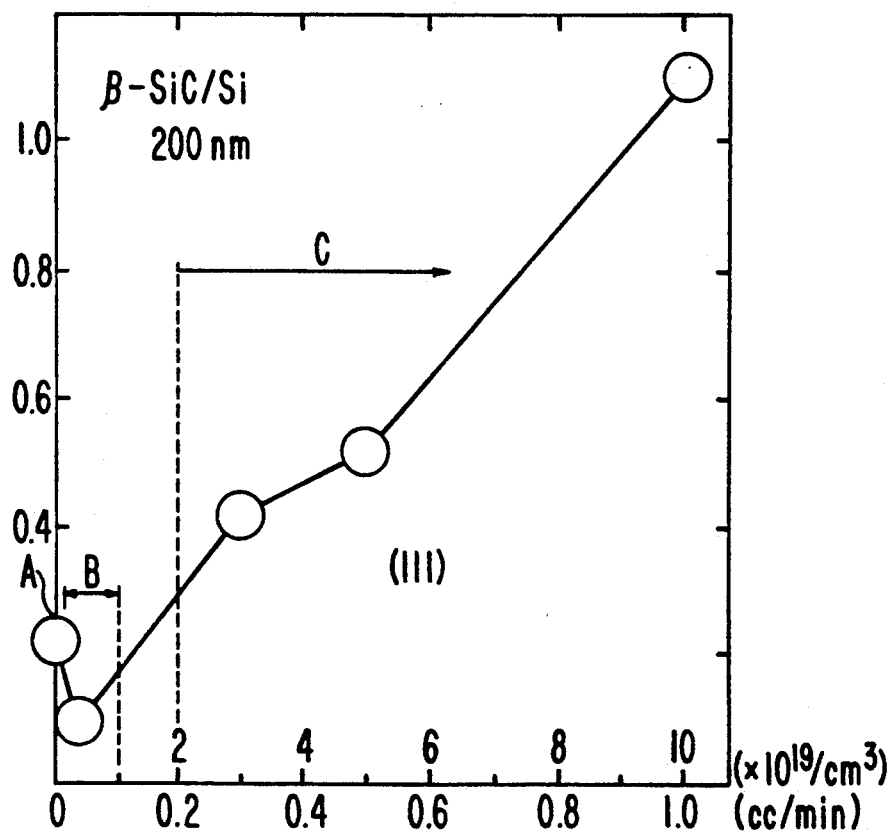
FIG. 6 is a graph showing the relationship between a half-value width of diffraction peak versus doping density for a SiC X-ray diffraction film as achieved with the present invention.

FIG. 6 is a graph showing the relationship between a half value width of diffraction peak versus doping density for a SiC film as achieved with the present invention. The FIG. 6 graph represents measurements of a $\beta$-SiC film formed on a 2000 Å thick silicon 2a substrate. Upon formation of the SiC film, an impurity gas such as ($PH_3$) is supplied to the reaction chamber. The lower horizontal axis index of FIG. 6 indicates doping density (cc/min) of the ($PH_3$) impurity gas, while the upper horizontal axis index indicates doping density ($1 \times 10^{19}/cm^3$) of impurity (P) included in the SiC film. The vertical axis indicates a half-value width of the X-ray diffraction beam peak (111) shown in FIGS. 5a and 5(b). In this graph, the narrower the half value width of the diffraction beam peak, the better the crystal property of the SiC film.

In FIG. 6, point A indicates an example characteristic obtained when no impurity is doped during formation of the SiC film. Such as case is illustrated in Japanese Laid-open Patent No. 62-216325. In this example, the half value width of the X-ray diffraction beam peak is about 0.2 (deg). The crystal structure of a SiC film formed in the manner giving rise to the point A characteristics is not a single crystal and the silicon lattice constant is deviated from that of SiC by about 20%. Therefore, a single crystal SiC film having a $2 \sim 3$ $\mu$m thickness as required for a membrane, cannot be formed with growth conditions giving rise to the point A characteristics.

If a SiC film is formed with a thickness of 2 $\mu$m using the growth conditions giving rise to the point A characteristics, the SiC film is polycrystalline. A polycrystalline SiC film has an uneven surface and use of such a SiC film as a membrane for an X-ray exposure mask results is not desirable. For example, with a polycrystalline film, a visible light beam, such as is used for mask alignment, is irregularly regulated at the surface of membrane.

A membrane formed in accordance with the first embodiment of the present invention has characteristics within region B of FIG. 6. In this example, the membrane is doped with (P) to a concentration in the range of $1 \times 10^{18}/cm^3 \sim 1 \times 10^{19}/cm^3$. In the region B of FIG. 6, the half value width of the X-ray diffraction beam peak is reduced compared to that point A. The basis for this result is that the SiC film grown with the conditions giving rise to the characteristics within the region B has a better crystal structure than that of a SiC film grown without doping the film with an impurity. Accordingly, with the present invention a thick single crystal SiC film can be formed on a silicon substrate even when the lattice constants of Si and SiC do not match.

The range C in FIG. 6 represents characteristics resulting from the second embodiment of the present invention. In this example, the membrane is doped with (P) to a concentration of at least $2\times10^{19}/cm^3$. Growing a SiC film to a thickness of $2\sim3$ μm in this manner, which is required for use as a membrane, results in an amorphous SiC film. On the other hand, when a SiC film is formed on a silicon substrate to a thickness of $2\sim3$ μm with conditions giving rise to the point A characteristics, the SiC film is polycrystalline as described previously. The inventors of the present invention believe that a SiC film becomes polycrystalline using the growth conditions giving rise to the point A characteristic, or becomes amorphous using the growth conditions giving to the region C characteristics because the impurity that is doped into the SiC film breaks the linkage of SiC molecules within polycrystalline particles. However, in an amorphous SiC film, the diameter of the amorphous particles is much smaller than that of polycrystalline SiC film particles. Thus, the film based on amorphous particles has an excellent flatness characteristic. The flatness of the amorphous film is slightly less than that of a single crystal SiC film.

According to the first embodiment of the present invention, a single crystal SiC film can be formed on a silicon substrate to a thickness of, for example, $2\sim3$ μm. Moreover, according to the second embodiment of the present invention, an amorphous SiC film can be formed on a silicon substrate. In both embodiments, the resultant SiC membrane has a flat surface that is suitable for an X-ray exposure mask. In addition, visible light is not irregularly reflected at the membrane surface.

With the present invention, β type amorphous SiC film can be grown. Such a film has a high Young's modulus (for example, $3.4\times10^{12}$ dyn/cm$^2$) and thus has improved resistivity to X-ray damage. As described, the present invention provides improved mirror surface characteristics by forming flat SiC film surfaces and provides a high quality X-ray mask.

We claim:

1. A method of fabricating an X-ray exposure mask including a substrate, said method comprising the steps of:
   (a) forming a SiC membrane on the substrate;
   (b) simultaneously doping the membrane with at least one of phosphorous, boron, nitrogen and oxygen; and
   (c) selectively forming a pattern of an X-ray absorber material on the membrane.

2. A method of fabricating an X-ray exposure mask according to claim 1, wherein step (a) includes the substep of forming said SiC membrane by chemical vapor deposition.

3. A method of fabricating an X-ray exposure mask according to claim 1, wherein said impurity comprises at least one of phosphorous, boron, nitrogen and oxygen.

4. A method of fabricating an X-ray exposure mask according to claim 1, wherein step (a) includes the substep of forming a single crystal SiC membrane.

5. A method of fabricating an X-ray exposure mask according to claim 4, wherein step (b) includes the substep of doping with phosphorous to a concentration in the range of $1\times10^{18}\sim1\times10^{19}$.

6. A method of fabricating an X-ray exposure mask according to claim 1, wherein step (a) includes the substep of forming an amorphous SiC membrane.

7. A method of fabricating an X-ray exposure mask according to claim 6, wherein step (b) includes the substep of doping with phosphorous to a concentration of approximately $2\times10^{19}$ or more.

8. A method of fabricating an X-ray exposure mask including a substrate, said method comprising the steps of:
   (a) forming a SiC membrane by chemical vapor deposition;
   (b) simultaneously doping the membrane with at least one of phosphorous, boron, nitrogen and oxygen; and
   (c) selectively forming a pattern of an X-ray absorber material on the membrane.

9. A method of fabricating an X-ray exposure mask according to claim 8, wherein step (a) includes the substep of forming a single crystal SiC membrane.

10. A method of fabricating an X-ray exposure mask according to claim 8, wherein step (a) includes the substep of forming an amorphous SiC membrane.

11. A method of fabricating an X-ray exposure mask including a substrate, said method comprising the steps of:
    (a) forming a SiC membrane on the substrate;
    (b) simultaneously doping the membrane with at least one of phosphorous, boron, nitrogen and oxygen;
    (c) forming a metal layer on the membrane;
    (d) forming a patterned resist layer on the metal layer; and
    (e) plating an X-ray exposure mask material onto the thin metal layer.

* * * * *